United States Patent

[11] 3,631,309

[72] Inventor Charles Frank Myers
Scottsdale, Ariz.

[21] Appl. No. 57,500
[22] Filed July 23, 1970
[45] Patented Dec. 28, 1971
[73] Assignee Semiconductor Electronic Memories, Inc.
Phoenix, Ariz.

[54] INTEGRATED CIRCUIT BIPOLAR MEMORY CELL
10 Claims, 8 Drawing Figs.

[52] U.S. Cl. .......... 317/235 R, 307/238, 307/279, 307/303, 317/235 E, 317/235 D, 317/235 Z
[51] Int. Cl. .......... H01l 19/00
[50] Field of Search .......... 317/235 (22.1), 235 (22); 307/213, 238, 279, 303

[56] References Cited

UNITED STATES PATENTS

| | | | |
|---|---|---|---|
| 3,218,613 | 11/1965 | Gribble et al. | 317/235 |
| 3,537,078 | 10/1970 | Pomeranz | 307/238 |
| 3,573,573 | 4/1971 | Moore | 307/303 |

*Primary Examiner*—Jerry D. Craig
*Attorneys*—Samuel Lindenberg and Arthur Freilich

ABSTRACT: An integrated circuit bipolar memory cell having two cross-coupled NPN transistors is provided in adjacent isolated regions of a silicon chip. Each region containing a transistor may include a diode and a large collector load resistor in parallel. A small resistor is provided in series with the diode, either in the same region or a separately isolated region. If in the same region, the small resistor may be included in the diode branch that is in parallel with the large resistor or in series between the cathode region of the diode and on N+ collector contact of the transistor. The base of the transistor and the anode of the diode are formed by diffusion of P-type impurities in an N-type film which serves as a collector region. While two emitters are diffused into the base region of the transistor, the same diffusant is used to form an N+ region across the anode region of the diode to form the large resistor as a thin channel for current conduction from the anode to the N+ region of the collector. The small resistor is formed in the bulk material of the silicon chip either between the cathode region of the diode and the collector region or in a separately isolated region.

CHARLES FRANK MYERS
INVENTOR.

BY
Lindenberg, Freilich & Wasserman
ATTORNEYS

CHARLES FRANK MYERS
INVENTOR.

BY
Lindenberg, Freilich & Wasserman
ATTORNEYS

CHARLES FRANK MYERS
INVENTOR

BY
Lindenberg, Freilich & Wasserman
ATTORNEYS

INTEGRATED CIRCUIT BIPOLAR MEMORY CELL

BACKGROUND OF THE INVENTION

This invention relates to integrated circuits, and more particularly to an integrated circuit having a large resistor in parallel with a diode in the same isolated region of a semiconductor chip as a transistor.

In the past, integrated circuit bipolar memory cells have been designed as essentially cross-coupled transistors, each with a separate collector load resistor. One method of realizing these collector load resistors consists of diffusing an opposite type of impurity into isolated regions of semiconductor bulk material. The sheet resistance of the diffused areas is generally that of the base diffusion which is typically between 100 and 200 ohms/sq. With 200 ohms./sq., such a resistor requires approximately 20 squares of diffused area, where a square unit of area is determined by a conventional four-point probe measurement technique used to obtain an average value of ohms per unit surface area. Bulk resistance values are then referenced to ohms per square surface area, or ohms/sq.

In addition to requiring so much space, resistors thus produced in an isolated region require contacts at each end along with a separate metallization scheme to interconnect the resistor with other elements of an integrated circuit.

It would be desirable to not only significantly reduce the area required for a resistor, but also provide the collector lead resistor in the same isolated region with other circuit components in order to avoid the need for separate interconnecting conductors because conductors used to interconnect components have parasitic resistance and capacitance that will degrade the response time of the integrated circuit. Moreover, by combining the components of an integrated circuit in such a way that isolating junctions are not required, further degradation of response time by the capacitance of isolating junctions is avoided. Still another advantage is that the reduced number of ohmic contact improves the reliability of the integrated circuit.

In an integrated circuit, bipolar memory cell consisting of two cross-coupled transistors in a configuration commonly referred to as flip-flop, it is desirable to provide a separate diode in parallel with each load resistor and second resistor either in series with the collector load resistor of each transistor or in a series circuit with the diode that is in parallel with the collector resistor to cooperate with the first resistor as a variable resistor load element to thereby increase current in the transistor when operated in a selected (readout) mode by at least one order of magnitude from an unselected (standby) mode, thus keeping power dissipation very low. To produce a memory cell in just two or four isolated regions of a semiconductor chip requires that the diode and parallel resistor associated with a given transistor be included in the isolated region of the transistor.

OBJECTS AND SUMMARY OF THE INVENTION

An object of this invention is to provide a novel integrated circuit having a transistor with a diode in series with its collector and a large resistor in parallel with the diode in one isolated region of a semiconductor film.

Another object of this invention is to provide an integrated circuit bipolar memory cell having two isolated regions for the cross-coupled transistors, each transistor having its collector load resistor in its own isolated region together with a diode which cooperate with the first resistor to provide a variable resistor load element, all without significantly increasing the area of the isolated region required for just the transistor and diode.

Yet another object of the present invention is to provide an integrated circuit bipolar memory cell having two cross-coupled transistors, each with its own collector load with extremely low parasitic resistance and capacitance.

A further object of this invention is the provision of an integrated circuit bipolar memory cell having improved reliability resulting from a reduced number of necessary contacts.

The foregoing and other objects of the invention are achieved in an integrated circuit bipolar memory cell arrangement wherein each of two cross-coupled transistors is produced together with a large collector load resistor in a separate one of two adjacent isolation regions. The bulk resistance in the isolation region constitutes the collector region of the transistor produced therein and may be used for a second small resistor between an N+ collector contact region and a diode in parallel with the large resistor produced by diffusion in the collector region while at least one emitter region is formed in a previously formed base region.

The large collector load resistor is provided as high sheet resistance in the region of the diode produced by the diffusion of impurities into the collector region. The high sheet resistance is achieved by reducing the cross-sectional area of the diode region where the current flows from one contact to the N+ collector contact region by diffusing across the current path in the diode region impurities of the same type as impurities in the collector region to a desired depth less than the depth of diffusion for the diode region. An ohmic contact is made with the original diode region on each side of the diffused region of opposite conductivity type to the collector. By extending this diffused region beyond the diode region and into the collector region, contact made between the end of the resistor thus formed and this diffused region also makes contact with the collector region to connect the end of the resistor remote from the diode contact to the emitter contact, thus obviating the need for any other contact besides the base and emitter contacts of the transistor. By interconnecting emitter contacts of transistors into adjacent isolation regions to a common emitter resistor, and cross connecting the base and collector contacts thereof through a suitable metallization pattern, an integrated circuit bipolar memory cell is provided. The small resistor is formed in the bulk material of the silicon chip, either between the cathode region of the diode and the collector region or in a separately isolated region. When the small resistor is in series with both the diode and the large resistor, the bulk material resistance may be increased by diffusing across the current path in the collector region impurities of the same type as impurities in the diode region to a desired depth less than the depth of diffusion for isolation. Alternatively, the diode may be connected directly to the collector of the transistor with the small resistor in a separately isolated region connected to the diode by a vapor deposited conductor over the isolating frame.

The novel features of the invention are set forth with particularity in the appended claims. The invention will best be understood from the following description when read in conjunction with the accompanying drawings.

DETAILED DESCRIPTION OF PREFERRED EMBODIMENT

Figure 1:
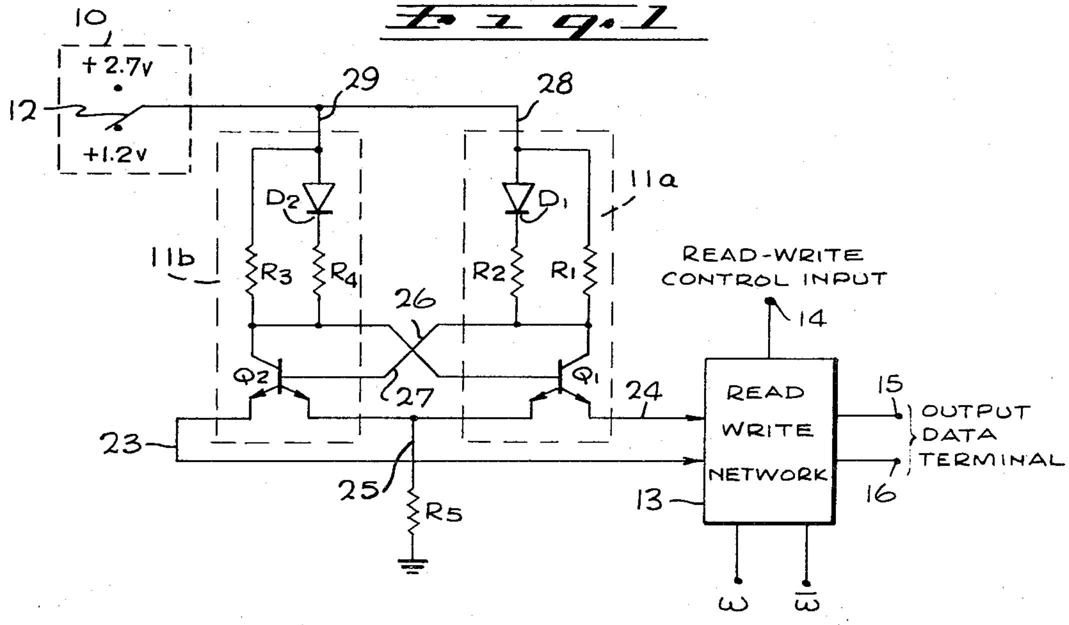
FIG. 1 is a circuit diagram of a bipolar memory cell of the type produced in accordance with the present invention.

Before proceeding with a detailed description of a preferred embodiment, a bipolar memory cell of the type to be produced as an integrated circuit in accordance with the present invention will first be described with reference to Fig. 1. It consists of two cross-coupled transistors $Q_1$ and $Q_2$, each transistors having a unique collector load and two emitters. The collector load connected to the transistor $Q_1$ consists of a parallel circuit comprising a first large resistor $R_1$ and a second smaller resistor $R_2$ in series with a diode $D_1$. Similarly, the collector load for the transistor $Q_2$ consist of a large resistor $R_3$ (equal to the resistor $R_1$) and a second smaller resistor $R_4$ (equal to the resistor $R_2$) in series with a diode $D_2$.

The respective loads of the transistors $Q_1$ and $Q_2$ are adapted to be connected to a source 10 of variable collector bias voltage, and one emitter of each of the transistors is adapted to be connected to circuit ground through a common resistor $R_5$. When the interconnected circuit components shown in dotted blocks 11*a* and 11*b* are thus connected to the collector by a source 10 and common emitter resistor $R_5$, the resulting circuit will function as a bipolar memory cell having four modes of operation: an unselected mode, a half selected mode, a fully selected mode and a write mode.

In the unselected mode, the collector bias voltage source 10 supplies 1.2 volts to the collector resistors $R_1$ and $R_3$, which is enough to keep the cell in a stable state, such as with the transistors $Q_1$ on and the transistor $Q_2$ off. The resistor values are so selected that the base current of the transistor $Q_1$ through the large resistor $R_3$ is sufficient to keep the transistor $Q_1$ conducting, and the emitter current of the transistor $Q_1$ through the resistor $R_5$ is sufficient to keep the transistor $Q_2$ biased off. This unselected mode may be referred to as the standby mode.

To readout a binary digit stored in the cell, the collector biased voltage from the source 10 is increased from +1.2 volts to +2.7 volts. Means for accomplishing that is illustrated as a single-pole, double-throw switch 12, but in practice would be accomplished through control of transistor switches formed as part of an integrated circuit on the same chip as the components in the blocks 11*a* and 11*b*.

Until the collector bias voltage is increased to +2.7 volts, the diodes $D_1$ and $D_2$ are insufficiently forward biased to conduct. Once the collector bias voltage is increased, the diodes $D_1$ and $D_2$ are sufficiently forward biased to supply more current to circuit ground through the resistor $R_5$. The increased current through the diode $D_2$ increases the base current of the transistor $Q_1$. That increased base current will cause the transistor $Q_1$ to increase its collector current, and that increase in collector current is conducted through the lower collector resistance of the resistors $R_1$ and $R_2$ now in parallel.

A read-write network 13 is connected to the second emitter of each of the transistors $Q_1$ and $Q_2$. That network may consist of two transistor channels which are biased off until a read-write control signal is applied to a terminal 14. Accordingly, both output terminals 15 and 16 of the network 13 will remain at zero volts until the read-write control signal is applied to the terminal 14 for the fully selected mode of operation of the cell.

In the fully selected mode, the second emitter of the transistor which is on will conduct current to produce a positive output signal at one of the terminals 15 and 16. For example, if $Q_1$ is on, the positive output signal is produced at the terminal 16. An operational amplifier having a differential input terminals may be connected to the output terminals 15 and 16 of the network 13 to provide a binary signal at an output terminal during the presence of the read-write control pulse. Alternatively, a D-type flip-flop may be connected to the output terminals 15 and 16 so that, upon the occurrence of a stroke (clock) pulse, the D-type flip-flop will be set in accordance with the binary information being read.

To store a binary digit in the bipolar memory cell, the collector bias voltage source 10 and the read-write network 13 are placed in the same state as in the fully selected mode for a read operation. At the same time, a positive pulse is applied to an input terminal W to drive the sense line connected to the second emitter of the transistor $Q_1$ positive. That drives the collector of the transistor $Q_1$ positive, and when that collector reaches about +1.2 volts, the base emitter junction of the transistor $Q_2$ is forward biased while the emitter of the transistor $Q_2$ is held near circuit ground indirectly through an input terminal $\overline{W}$. At this point, the transistor $Q_2$ turns on fully, thereby removing the forward bias condition at the base of the transistor $Q_1$ to turn it off. If the input terminal $\overline{W}$ of the network 13 receives a positive pulse during a write operation, while the input terminal W is held at near circuit ground, the transistor $Q_2$ will be turned off if it is on, and the transistor $Q_1$ will be turned on.

The advantage of providing the diodes $D_1$ and $D_2$ in series with respective resistors $R_2$ and $R_4$ in the memory cell is that in the unselected (standby) mode, a minimum of current is conducted through the large resistors $R_1$ and $R_3$. Collector current is then increased only while storing or reading out a binary digit. The higher collector current level results from forward biasing the diodes $D_1$ and $D_2$ when the collector bias voltage source 12 is switched from +1.2 volts to +2.7 volts as just described with reference to the half selected mode. However, it should be understood that neither the circuit of the bipolar memory cell nor the manner in which it is used constitutes any part of the present invention which is directed to forming the transistors $Q_1$ and $Q_2$ in two adjacent isolated regions of an integrated circuit chip with the large collector load resistors of the transistors formed with the transistors and the diodes in the two isolated regions. In other words, the present invention pertains only to providing the interconnected components shown in FIG. 1 within the dotted blocks 11*a* and 11*b* on a chip as an integrated circuit using only two isolated regions of the chip as will be described for a first embodiment of the invention with reference to FIGS. 2 and 3. A second embodiment will then be described with reference to FIGS. 5 and 6. In a third embodiment, to be described with reference to FIGS. 7 and 8, the small resistors are produced in separately isolated regions, but since these resistors are small, the separate regions required for them are small. What is important in the third embodiment is that the large resistors and diodes are produced in the isolated regions of the transistors. The area which would otherwise be required is shown in FIG. 4.

Figures 2, 3:
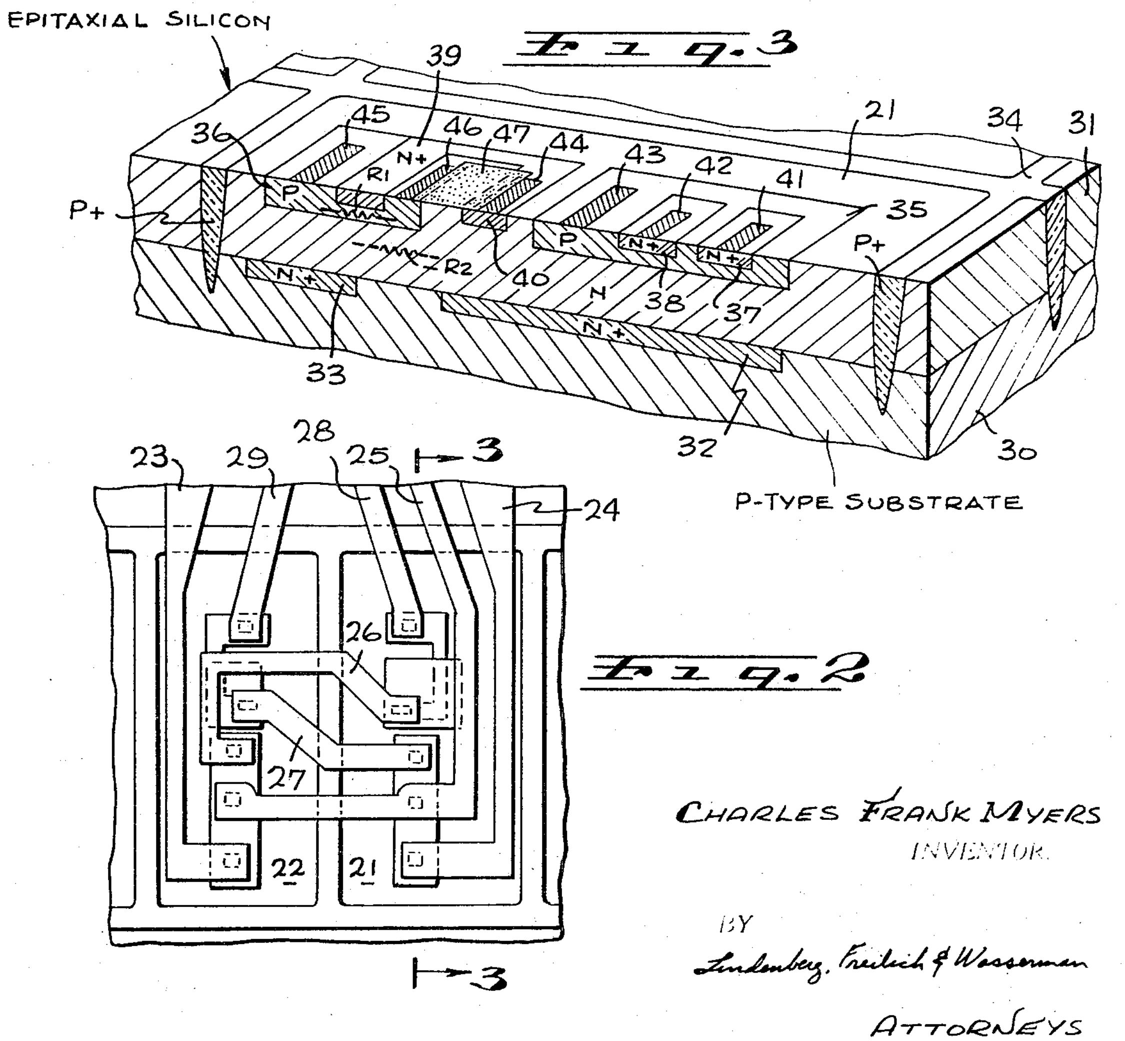
FIG. 2 is a top view of the circuit of FIG. 1 provided in a semiconductor chip in accordance with the present invention using conventional integrated circuit techniques.
FIG. 3 is an isometric sectional view taken along the line 3—3 of FIG. 2, but presented in a somewhat idealized form before metallization of contacts and conductors.
Figure 4:
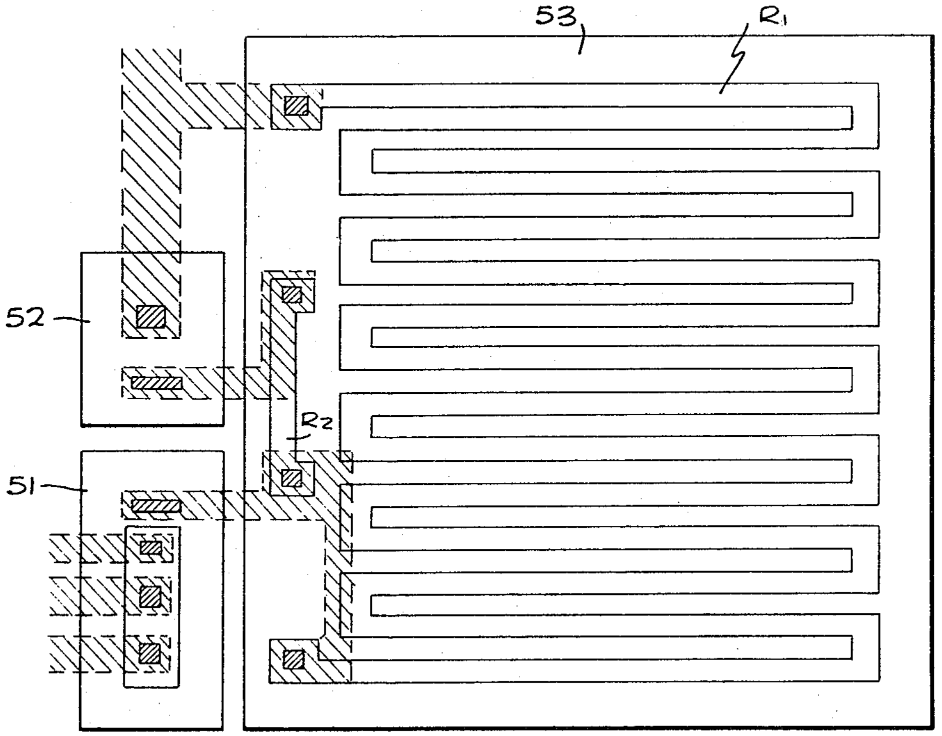
FIG. 4 illustrates in a plain view the arrangement of the circuit of FIG. 1 in a semiconductor chip in accordance with the prior art.

Referring now to FIG. 2, which shows a top view of a portion of a semiconductor chip with the circuit of FIG. 1 formed therein, the patterns for interconnections between components in two isolated regions 21 and 22 are formed by conventional vapor deposition and photoresist technique. Interconnections 23 and 24 correspond to the sense lines connected to the second emitters of the transistors $Q_1$ and $Q_2$. An interconnection 25 connects the first emitter of the transistor $Q_1$ to the emitter of the transistor $Q_2$, and to the resistor $R_5$ in the circuit of FIG. 1 but not included in FIG. 2. An interconnection 26 corresponds to the interconnection of the collector of the transistor $Q_1$ to the base of the transistor $Q_2$ in the circuit of FIG. 1. Similarly, an interconnection 27 corresponds to the interconnection of the collector of the transistor $Q_2$ to the base of the transistor $Q_1$. The remaining interconnections 28 and 29 correspond to connections of the anodes of the diodes $D_1$ and $D_2$ to the variable collector bias source 10 shown in FIG. 1 but not included in FIG. 2. To facilitate understanding FIG. 2, the reference numerals of the metallized interconnections are used in FIG. 1 for the corresponding interconnections schematically shown.

It should, of course, be understood that components are formed in both isolated regions 21 and 22 simultaneously, but reference will now be made to forming only the components in the region 21. Briefly, the anode of the diode $D_1$ is formed in the isolated N-type semiconductor region 21 while the base of the transistor $Q_1$ is being formed by diffusing P-type impurities. The resistor $R_1$ connected between the anode of the diode $D_1$ and the collector of the transistor $Q_1$ consists of the bulk material in the anode region between the anode contact of the diode and the collector contact of the transistor. Since the resistor $R_1$ is to be very large, the sheet resistance of that bulk material is substantially increased by decreasing its thickness. As will be described more fully with reference to FIG. 3, that is accomplished by diffusing an N+ region across the anode region. The resistor $R_2$ connected between the cathode of the diode $D_1$ and the collector of the transistor $Q_1$ consists of the resistance of the bulk material of the isolated region 21 between the PN junction of the diode $D_1$ and the collector contact.

The manner in which the diode $D_1$ and the resistors $R_1$ and $R_2$ are formed in the isolated region of the transistor $Q_1$ will now be more fully described with reference to FIG. 3, which is an idealized cross-sectional view of FIG. 2 taken along the line 3—3 with the metallized interconnections 23 to 29 omitted. This somewhat idealized sectional view is being presented to simplify understanding the present invention.

The structure of FIG. 3 is formed by starting with a P-type substrate 30 having an N-type silicon film 31. Such starting material is available commercially in wafers, but is preferably produced by beginning with a wafer of P-type silicon and growing an epitaxial film of N-type silicon approximately 6 microns thick. That film ultimately becomes the collector region of the transistor $Q_1$ and the cathode of the diode $D_1$.

Before growing the epitaxial film 31, heavily doped (N+) regions 32 and 33 are produced in the substrate 30 by selective diffusion of N-type impurities, such as arsenic, which remain localized during subsequent process steps. This is standard practice to improve the $V_{ce(SAT)}$, $BV_{CBO}$ and collector time constant of the transistor. The effect of the heavily doped N-type region is to reduce the effective sheet resistance in the collector without degrading the collector voltage and capacitance characteristics of the transistor. The space in the substrate between the heavily doped regions 32 and 33 is left doped with P-type impurities in order to provide the desired resistance in the bulk material of the N-type film for the resistor $R_2$.

Once the film 31 is epitaxially grown, but before the transistor and the diode are formed by diffusion, the region 21 is isolated by diffusing P-type material, such as boron, to form a frame 34 extending through the film 31 of the substrate 30. Isolation results because of the double PN junction formed around the region 21 by the frame 34, such that no matter what polarity of potential might develop between two adjacent regions, there will always be a back-biased PN junction between them. The photolithographic process for this isolation diffusion step, and all other diffusion steps, are standard in the art of fabricating surface passivated integrated circuits.

The next step consists of diffusing P-type impurities in regions 35 and 36 to form the base of the transistor $Q_1$ and the anode of the diode $D_1$, respectively. Following that, N-type impurities are diffused into the base region 35 and the anode region 36 to form N+ emitter regions 37 and 38 in the base region 35 and an N+ region 39 extending across the anode region 36 in a portion thereof next to the base region 35 and further extending into an area 40 of the collector region between the P-type regions 35 and 36 to provide an N+ region for an ohmic collector contact. Thereafter, ohmic contacts 41 to 46 are vapor deposited.

The contacts 41 and 42 are for the two emitters and the contact 43 is for the base of the transistor $Q_1$. The contact 44 is for the collector of the transistor $Q_1$ while the contact 46 connects the anode region 36 along the side thereof remote from the anode contact 45 to the collector contact through a vapor deposited metal film 47 in order to connect one end of the resistor $R_1$ formed by the sheet resistance of the bulk material in the anode region 36 beneath the N+ region 39 to the collector contact 44. The resistor $R_1$ is schematically indicated using a dotted line symbol and the reference numeral $R_1$ on the portion of the region 36 forming that resistor.

By extending the N+ region beyond the anode region 36, and providing the ohmic contact metal film 47 as just described, contact is provided to both the collector of the transistor and the end of the resistor $R_1$. The N+ channel which runs around the contact 46 and into the area 40 under the contact 47. In practice, the area 40 is placed very near the anode area 36 and one conductor is deposited for the contacts 44 and 46, and interconnection 47 at the same time that all other contacts, and interconnections 23 to 29 (FIG. 2) are deposited.

The resistor $R_1$ and the diode $D_1$ can be formed in the same isolation region 21 if the sum of the alpha's between the collector-base junction of the transistor and the cathode-anode junction of the diode is less than unity. This can be achieved by either constraining the geometry of the diode $D_1$ and resistor $R_1$ or controlling the diffusion processes, or by both constraining the geometry and controlling the diffusion processes.

The structure of the diode $D_1$, resistor $R_1$ and transistor $Q_1$ is similar in construction to a lateral gate controlled four-layer diode or silicon gate controlled rectifier (SCR). However, the design, process, and circuit constraints are such that this structure will never operate in the SCR mode.

In any given circuit constraint, the device will not operate in the SCR mode, provided the sum of the alphas of the collector-base junction and cathode-anode junction is less than unity. The alphas of both junctions are a function of the lifetime of the minority carriers. One typical technique of controlling the lifetime is diffusing a controlled amount of gold into the device structure.

Also, the alphas are functions of the distance between the junctions. Therefore, by designing the device such that the spacing is the correct distance in relationship to the lifetime, the sum of the alphas can be controlled to less than unity. Still other methods may be employed to obtain a sum of alphas of less than unity.

The diode $D_1$ consists of the PN junction between the anode region 36 and the isolation region 21 in only the area generally overlaid by the anode contact 45. Accordingly, the cathode of the diode may be considered to be that portion of the isolation region below the contact 45. The resistor $R_2$ is then the bulk resistance of the isolation region from the cathode of the diode $D_1$ to the collector contact 44. That portion of the isolation region 21 forming the resistor $R_2$ is indicated by a dotted line symbol for the resistor and the reference numeral $R_1$.

The heavily doped N+ regions 32 and 33 will reduce the effective sheet resistance in the cathode of the diode. This is so because the current path in the cathode and the collector of the diode and transistor is transverse, or parallel to the surface of the integrated circuit. Accordingly, heavily doped N+ regions 32 and 33 are provided only beneath the cathode and collector regions of the respective diode and transistor in the arrangement of the present invention illustrated in FIG. 3, not below that portion of the isolated region 21 relied upon for the resistor $R_2$. In practice, the value of the resistor $R_2$ can be set by setting the space between the heavily doped N+ regions 32 and 33.

Once the internally connected components of the circuit of FIG. 1 have been formed as described with reference to FIG. 3, and the metallized contacts 41 to 46 and interconnections 23 to 29 have been formed, the circuit in the dotted line block **11*b*** of FIG. 1 is complete. As in other process steps, conventional photolithographic techniques are used to form the metallized contacts and interconnections.

Referring now to FIG. 4, the prior art technique of providing separately isolated regions for the circuit components will now be described to emphasize principal advantages of the present invention. A typical layout of three isolation regions 51, 52 and 53 have been previously required to form the transistor, diode and resistors. The transistors $Q_1$ and diode $D_1$ have been formed in the respective isolation regions 51 and 52 using standard techniques generally as described for the present invention, but the resistors $R_1$ and $R_2$ have been formed by diffusing an opposite (P-type) impurity into the localized regions shown while forming the base and anode regions of the transistor and diode. Since the resistor $R_1$ is very large, and the diffused localized regions have a relatively low resistance per square, a large total area is required. For example, assuming 100 ohms/sq., and a desired resistance of 20K ohms for the resistor $R_1$, approximately 200 squares are required.

A principal advantage of the present invention is a substantial reduction in area required for the large resistors $R_1$ and $R_3$ in the circuit of FIG. 1 so that more memory cells can be placed on a given silicon chip. Another advantage is reduction of parasitic resistance and capacitance by obviating the need for metallized interconnections to the resistors. This will increase switching speed of the memory cells. The present invention also obviates the need for PN isolation junctions between the diode and transistor which would also have capacitance that would degrade switching time. Still another advantage is improved reliability because the number of metallized contacts required is reduced since internal interconnections for the diode and resistors are used. Contacts between two different types of material, such as aluminum and silicon, tend to alloy which will degrade the PN junctions of the circuit. Moreover, poor adhesion between material may tend to cause an open circuit. Also, high current density at the perimeter of a contact may cause current induced migration of the conductor and eventually erode the conductor away. And finally, some alloys become brittle and contacts may open when the circuit is thermally cycled. Thereafter, it is important to keep the number of contacts required to a minimum.

Figure 5:
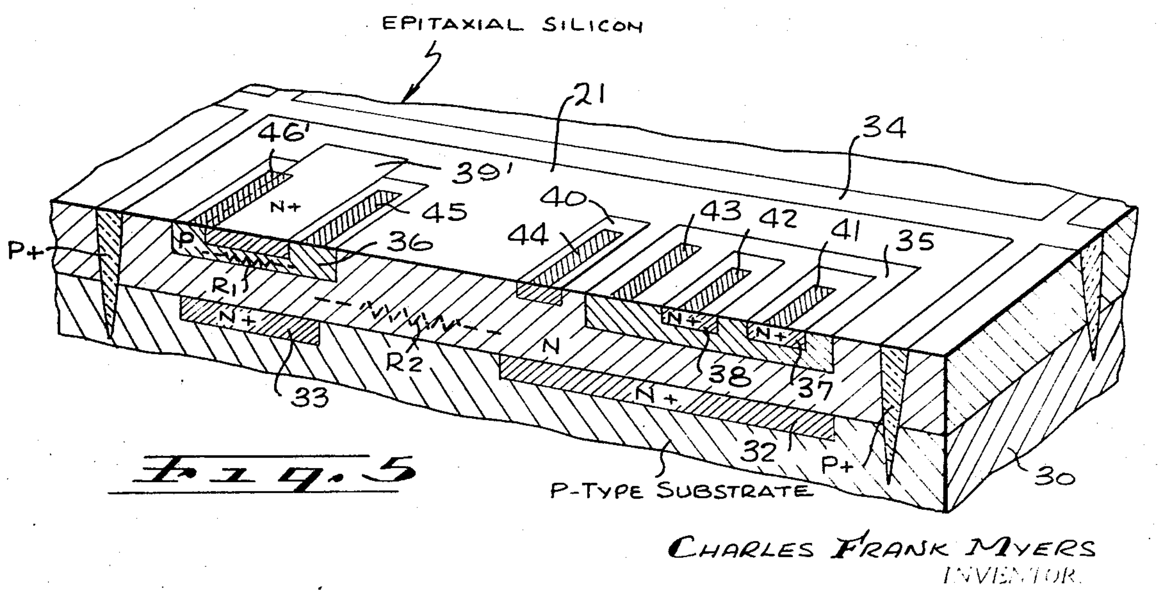
FIG. 5 is an isometric sectional view of a second embodiment presented in a somewhat idealized form before metallization of contacts and conductors.
Figure 6:
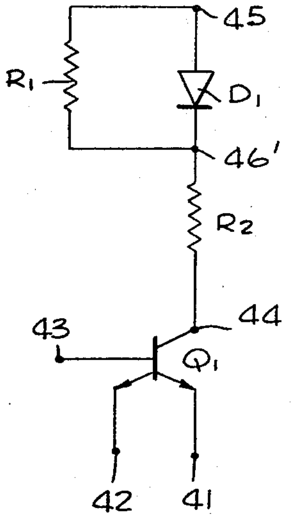
FIG. 6 is a schematic diagram of the embodiment of FIG. 5.

Referring now to FIGS. 5 and 6, a second embodiment to disclosed. The sectional view of FIG. 5 is similar to the sectional view of FIG. 3; accordingly, like elements are identified by the same reference numerals as in FIG. 3. The electrical difference is that the small resistor is connected between the transistor $Q_1$ and a parallel arrangement of the diode $D_1$ and large resistor $R_1$, as shown in the schematic diagram of FIG. 6.

The small resistor $R_2$ is provided as the bulk resistance of the isolated collector region between the N+ collector contact region and the nearest side of the anode region 36. The parallel arrangement of the diode $D_1$ and large resistor $R_1$ is provided in a manner similar to the first species, but with a slightly different and reversed geometry. An N+ region 39′ is diffused across the current path in the P region 36 and into the collector region 21. The anode contact 45 is then deposited on the P region between the N+ regions 39′ and 40. The opposite side of the N+ region 39′ is then connected to the P region 36 by an ohmic contact 46′ which overlaps both the P region 36 and the N+ region 39′ thereby connecting the left end of the large resistor 39′ to the left end of the resistor $R_2$, leaving the right end of the resistor $R_1$ connected to the contact 45.

When the diode junction is forward biased, current flows directly from the anode contact 45 to the left end of the resistor $R_2$ through the PN junction. Otherwise, the current flow is through the large resistor $R_1$ to the contact 46′ into the N+ region 39′ and from there to the left end of the resistor $R_2$.

Figure 7:
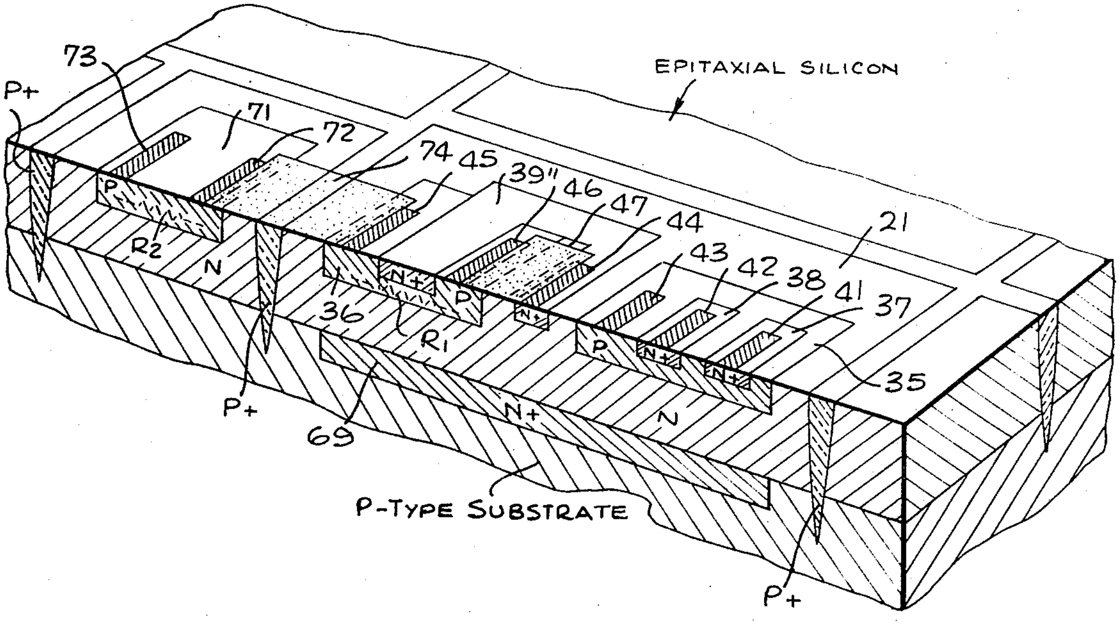
FIG. 7 is an isometric sectional view of a third embodiment presented in a somewhat idealized form before metallization of contacts and conductors.
Figure 8:
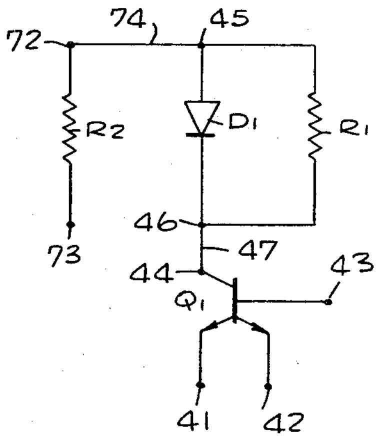
FIG. 8 is a schematic diagram of the embodiment of FIG. 7.

The embodiment of FIG. 7 is like that of FIG. 3, except that a heavily doped N+ region 69 is provided beneath the collector region 21 from the left of the P region 36 to the right of the P region 35 to reduce the bulk resistance where the resistor $R_2$ is provided in the embodiment of FIG. 3. The resistor $R_2$ is then provided in a separately isolated region 70 by diffusing P-type impurities in a region 71, and depositing contacts 72 and 73 in the usual manner with a metallized interconnection from the contact 72 to the anode contact 45. The contacts and interconnections are vapor deposited at the same time as are all contacts and interconnections. The distinction between contacts and interconnections is that the contacts are formed by metal deposited through windows etched in an oxide coating while interconnections are being formed by depositing metal over the oxide coating, as it will be understood by those skilled in the art.

In this embodiment the N+ region 39″ may overlap the collector region 21 on the sides, as shown, since the collector region is not being used to form the small resistor $R_2$. The result is the circuit configuration of FIG. 8.

Although a particular embodiment of the invention has been described and illustrated herein, it is recognized that modifications and variations may readily occur to those skilled in the art, such an integrated circuit arrangement with a PNP transistor in place of the NPN transistor, and the PN junction diode reversed. Another variant may be to increase the resistance of the resistor $R_1$ by making the collector region relied on for that resistor the channel region of a junction FET in a manner similar to the way the resistor $R_2$ has been increased. Consequently, it is intended that the claims be interpreted to cover such modifications and equivalents.

What is claimed is:

1. In an integrated circuit formed by controlled diffusion of impurities into a film of semiconductor type material initially prepared with impurities of a given one of N and P types for substantially uniform resistivity, the combination comprising:

means for isolating a region of said film to form a transistor collector region;

a first portion of said isolated region diffused with impurities of the other one of said N and P types to a predetermined depth to form a transistor base region;

at least one portion of said base region being heavily diffused with impurities of the same type as said collector region to form a transistor emitter region;

a second portion of said isolated region spaced a predetermined distance from said base region and diffused with impurities of the same type as said base region to form an external terminal region for a PN junction diode, thereby effectively providing a diode with an internal terminal region connected to said transistor collector region;

means for forming a first ohmic contact on said collector region between said base region and said second portion to provide a collector terminal;

a transverse portion extending across said external terminal region of said diode in a given direction substantially normal to a line from the center of said external terminal region and said base region, with first and second substantial surface areas of said external terminal region not covered by said transverse portion, one on each side of said transverse portion normal to said line, said transverse portion being heavily diffused to a predetermined depth with impurities of the same type as said emitter region to provide a current path of predetermined high resistance through said external terminal region of said diode from said first surface area to said second surface area;

means for forming a second ohmic contact to said emitter region;

means for forming a third ohmic contact to said base region;

means for forming a fourth and fifth ohmic contacts to said external terminal region of said diode on said first and second surface areas, respectively: and means for providing electrical continuity from said fifth ohmic contact to said first ohmic contact through a low impedance path, whereby a diode is provided between said first ohmic contact and said fourth ohmic contact, and a large resistor in parallel with said diode to provide high impedance between said first and fourth ohmic contacts when said diode is back biased, and low impedance between said first and fourth ohmic contacts when said diode is forward biased.

2. The combination of claim 1 wherein said film of semiconductor type material is provided on a substrate diffused with impurities of the other one of said N and P types with a localized region heavily diffused to a predetermined depth in said substrate on the face thereof interfacing with said collector region over a continuous area beneath the external terminal region of said diode and said base region of said transistor, and the space between said external terminal region and said base region to reduce the sheet resistance of said collector region.

3. The combination of claim 2 including:

means for isolating a second region of said film;

a portion of said second region diffused with impurities of the other one of said N and P types to a predetermined depth to form a resistor region;

a pair of ohmic contacts on said resistor region spaced apart to provide a resistor between said pair of ohmic contacts; and means for connecting one ohmic contact of said pair of ohmic contacts to said fourth ohmic contact to provide a resistor in series with said diode.

4. The combination of claim 1 wherein said film of semiconductor type material is provided on a substrate diffused with impurities of the other one of said N and P type with a localized region heavily diffused to a predetermined depth in said substrate on the face thereof interfacing with said collector region with impurities of said given one of N and P types over a discontinuous area beneath the external terminal region of said diode and said base region of said transistor to reduce the sheet resistance of said collector region except in that portion of the collector region between said first and fourth ohmic contact, thereby providing a current path of predetermined resistance forming a small resistor connected between said diode and said first ohmic contact.

5. The combination of claim 4 wherein said fourth ohmic contact is on a side of said transverse region remote from said first ohmic contact, whereby said small resistor is provided in series with said diode between said fourth and fifth ohmic contacts such that said large resistor is in parallel with said series connected diode and small resistor.

6. The combination of claim 5 wherein said means for providing electrical continuity from said fifth ohmic contact to said first ohmic contact comprises a metallized conductor from said fifth ohmic contact directly to said first ohmic contact.

7. The combination of claim 6 wherein said first ohmic contact is provided on a region heavily diffused with impurities of the same type as said transverse region, and said transverse region extends over said external terminal region of said diode only laterally in a direction toward said base region and integral with said heavily diffused region provided for said first ohmic contact.

8. The combination of claim 4 wherein said fourth ohmic contact is on a side adjacent to said first ohmic contact, whereby said small resistor is provided in series with each of said diode and said large resistor, and said diode and said large resistor are connected in parallel.

9. The combination of claim 8 wherein said means for providing electrical continuity from said fifth ohmic contact to said first ohmic contact comprises an ohmic contact on said transverse region connected to said fifth ohmic contact, whereby a current path is provided from said fourth ohmic contact to said first ohmic contact through said transverse region and through the small resistor portion of said collector region when said diode is back biased.

10. The combination of claim 7 wherein said first ohmic contact is provided on a region heavily diffused with impurities of the same type as said transverse region, and said transverse region extends over said external terminal region of said diode laterally in a direction toward said base region and integral with said heavily diffused region provided for said first ohmic contact.

* * * * *